(12) United States Patent
Caiafa

(10) Patent No.: US 9,160,325 B2
(45) Date of Patent: Oct. 13, 2015

(54) SYSTEMS AND METHODS FOR FAST KILOVOLT SWITCHING IN AN X-RAY SYSTEM

(71) Applicant: General Electric Company, Schenectady, NY (US)

(72) Inventor: Antonio Caiafa, Colonie, NY (US)

(73) Assignee: General Electric Company, Niskayuna, NY (US)

(*) Notice: Subject to any disclaimer, the term of this patent is extended or adjusted under 35 U.S.C. 154(b) by 279 days.

(21) Appl. No.: 13/746,911

(22) Filed: Jan. 22, 2013

(65) Prior Publication Data

US 2014/0205070 A1 Jul. 24, 2014

(51) Int. Cl.
*H03K 17/04* (2006.01)
*H05G 1/10* (2006.01)
*H03K 17/042* (2006.01)

(52) U.S. Cl.
CPC .......... *H03K 17/04* (2013.01); *H03K 17/04206* (2013.01); *H05G 1/10* (2013.01); *H03K 2217/009* (2013.01); *H03K 2217/0009* (2013.01)

(58) Field of Classification Search
CPC ............. H01J 2235/02; H01J 2235/0236; A61N 2005/1091; G01N 2223/304; H05G 1/30; H05G 1/32; H05G 1/40; H05G 1/42; H05G 1/56; H05G 1/58; H05G 1/10; H05G 1/06; H05G 1/54; H05G 1/20; H03K 17/60; H03K 17/74; H03K 17/68; H03K 17/04; H01L 29/00; Y02E 60/12; H01M 10/44; H01M 6/06; H01M 6/5077; H02J 7/0075; C07D 401/04; C07D 223/12; C07D 401/12; C07D 403/04; C07D 405/12

USPC .................. 378/91, 98, 98.9, 101, 111, 112, 378/114–116; 363/59, 60; 315/1, 107, 291; 314/115, 135; 307/112
See application file for complete search history.

(56) References Cited

U.S. PATENT DOCUMENTS

| 4,013,923 | A * | 3/1977 | den Hollander | 315/411 |
|---|---|---|---|---|
| 6,366,030 | B1 * | 4/2002 | Ito et al. | 315/291 |
| 7,529,344 | B2 | 5/2009 | Oreper | |
| 7,826,587 | B1 | 11/2010 | Langan et al. | |
| 8,165,264 | B2 | 4/2012 | Zou | |
| 2005/0018815 | A1 | 1/2005 | Loef et al. | |

(Continued)

FOREIGN PATENT DOCUMENTS

WO  2012104740 A1  8/2012

OTHER PUBLICATIONS

Zou et al., "Analysis of Fast kV-switching in Dual Energy CT using a Prereconstruction Decomposition Technique", Medical Imaging 2008 Physics of Medical Imaging Proc. of SPIE, pp. 1-12, vol. 6913, Mar. 18, 2008.

(Continued)

*Primary Examiner* — Glen Kao
(74) *Attorney, Agent, or Firm* — Robert M. McCarthy

(57) ABSTRACT

Various of the disclosed embodiments contemplate systems and methods in an X-ray imaging system, such as a CT system, facilitating more crisp switching between high and low voltages at an X-ray tube. Certain embodiments circuits which store and discharge energy to improve voltage rise and fall times. These circuits may mitigate the effects of losses, hysteresis cycles, and leakage currents. More controlled voltage rise and fall times may improve X-ray emission and detection synchronization.

20 Claims, 14 Drawing Sheets

(56) References Cited

U.S. PATENT DOCUMENTS

| | | |
|---|---|---|
| 2009/0027054 A1 | 1/2009 | Biber et al. |
| 2010/0189225 A1* | 7/2010 | Ernest et al. .................. 378/103 |
| 2011/0142193 A1 | 6/2011 | Frontera et al. |
| 2012/0027164 A1 | 2/2012 | Caiafa et al. |
| 2012/0155613 A1 | 6/2012 | Caiafa et al. |
| 2012/0155614 A1 | 6/2012 | Caiafa et al. |
| 2012/0223714 A1 | 9/2012 | Greim |

OTHER PUBLICATIONS

Schoepf., "Article Series "Dual-Energy CT: What about Radiation Dose?" (1/3)—Introduction", Dual Source CT Experts Community, May 11, 2011.

Zhao et al., "Dual Source, Dual Energy Computed Tomography in Pulmonary Embolism", Intechopen, pp. 1-16, 2012.

PCT Search Report and Written Opinion issued May 16, 2014 in connection with corresponding PCT Patent Application No. PCT/US2014/012518.

* cited by examiner

SYSTEMS AND METHODS FOR FAST KILOVOLT SWITCHING IN AN X-RAY SYSTEM

BACKGROUND

The subject matter disclosed herein relates generally to voltage switching systems, and more particularly, to methods and apparatus for voltage switching in imaging systems, such as diagnostic X-ray imaging systems.

In conventional computed tomography (CT) X-ray imaging systems, an X-ray source emits a cone-shaped X-ray beam toward a subject or object, such as a patient or piece of luggage. The beam, after being attenuated by the subject, impinges upon an array of radiation detectors. The intensity of the attenuated beam radiation received at the detector array is dependent upon the attenuation of the X-ray beam by the subject. Each detector element of the detector array produces a separate electrical signal indicative of the X-ray intensity received by that particular detector element. The electrical signals are quantized and transmitted to a data processing system for analysis, which generally results in the presentation of an image.

CT imaging systems may comprise energy-discriminating (ED), multi-energy (ME), and/or dual-energy (DE) CT imaging systems that may be referred to as an EDCT, MECT, and/or DECT imaging system. The EDCT, MECT, and/or DECT imaging systems are configured to measure energy-sensitive projection data. The energy-sensitive projection data may be acquired using multiple applied X-ray spectra by modifying the operating voltage of the X-ray tube or utilizing X-ray beam filtering techniques (e.g., energy-sensitive X-ray generation techniques), or by energy-sensitive data acquisition by the detector using energy-discriminating, or with photon counting detectors or dual-layered detectors (e.g., energy-sensitive X-ray detection techniques).

With X-ray generation techniques, various system configurations utilize modification of the operating voltage of the X-ray tube including: (1) acquisition of projection data from two sequential scans of the object using different operating voltages of the X-ray tube, (2) acquisition of projection data utilizing rapid switching of the operating voltage of the X-ray tube to acquire low-energy and high-energy information for an alternating subset of projection views, or (3) concurrent acquisition of energy-sensitive information using multiple imaging systems with different operating voltages of the X-ray tube.

EDCT/MECT/DECT provides energy discrimination capability that allows material characterization. For example, in the absence of object scatter, the system utilizes signals from two applied photon spectra, namely the low-energy and the high-energy incident X-ray spectrum. The low-energy and high-energy incident X-ray spectra are typically characterized by the mean energies of the applied X-ray beams. For example, the low-energy X-ray spectrum comprises X-ray photons with lower-energy photons, resulting in a lower mean energy, relative to the high-energy X-ray spectrum. The detected signals from low-energy and high-energy X-ray spectra, either from two different applied spectra (X-ray generation techniques) or by regions of the same applied spectrum (X-ray detection techniques) provide sufficient information to estimate the effective atomic number of the material being imaged. Typically, X-ray attenuation mechanisms (Compton scattering or Photoelectric absorption) or the energy-sensitive attenuation properties of two basis materials (typically water and calcium for patient scanning) are used to enable estimation of the effective atomic number.

Dual-energy scanning can obtain diagnostic CT images that enhance contrast separation within the image by utilizing energy-sensitive measurements. To facilitate processing of the energy-sensitive measurements, the applied X-ray spectrum should be constant during an integration period. For example, such CT systems that acquire interleaved subsets of low-energy and high-energy projection data (versus two separate scans) should operate to maintain the accelerating voltage steady during an acquisition interval. Also, the change from one voltage level to another voltage level should occur very rapidly. Less stable X-ray tube operating voltages and/or slower operating voltage switching times result in a reduction in the difference in effective mean energy (the average of the mean energy of time-varying X-ray spectrum) of the applied X-ray spectra, which reduces the fidelity of the system in characterizing different materials.

Thus, while switching the X-ray tube potential (voltage), for example, by using high-frequency generators, may solve some of the problems related to conventional dual-energy scanning (acquiring energy-sensitive projection data on alternate scans of the object), such a configuration does not always provide the switching speed needed for certain imaging applications. For example, cardiac imaging cannot be effectively performed by simply switching the X-ray source potential between two sequential scans of the human thorax due to cardiac motion. Furthermore, for systems utilizing rapid switching of the X-ray potential for subsets of projection angles, the switching speed of the X-ray tube potential may not be sufficient for the fast gantry rotation speeds required to freeze motion for cardiac imaging. There is often a delay in the response time of the switched operating potential between the high frequency generator and the X-ray tube, due in part to the capacitance of the cable connecting the device and the X-ray tube.

The delay in response time is dependent on the X-ray beam current of the X-ray tube as the beam current also either helps or hinders the discharge of the associated system capacitance. Accordingly, the rise time in switching the generator from a first (low) voltage, or low kVp, level to a second (high) voltage, or high kVp, level is limited by the power of the high-voltage generator, which may be suboptimal for dual-energy imaging in many medical applications. Similarly, the fall time between switching the high kVp to a low kVp level is generally very slow due to the need to discharge the system capacitance, which effectively reduces the energy separation of the applied spectra, resulting in reduced material characterization sensitivity and, therefore, the effectiveness of the dual-energy imaging. As such, these insufficient switching speeds often lead to projection data pair inconsistencies resulting in streak artifacts in reconstructed images. Additionally, many industrial CT systems for baggage inspection utilize stationary anode tube configurations that have an X-ray beam current that is an order of magnitude or more lower than the X-ray beam current used with medical CT system employing rotating-anode technology. As such, the time required to switch the operating voltage of the X-ray tube is prohibitively long.

For radiographic X-ray imaging systems, the limitations mentioned above also apply. Radiographic X-ray systems acquire one or more views of the imaged object, which may be presented as two-dimensional projection images, or in some cases where several more projection data are acquired, as three-dimensional images generated using tomosynthesis techniques. The aforementioned limitations regarding switching speed apply to X-ray radiographic or tomosynthesis systems such as due to the capacitance of the high-voltage cable connecting the generator to the X-ray tube, the X-ray tube capacitance itself, the power of the generator, and the X-ray beam current that may limit switching speed.

SUMMARY

Certain embodiments contemplate an electronic system for improving power system control comprising: a first inductor comprising a first terminal and a second terminal; a switching arrangement comprising: a first diode comprising a cathode terminal and an anode terminal; a second diode comprising a cathode terminal and an anode terminal; a first switch comprising a first terminal and a second terminal; and a second switch comprising a first terminal and a second terminal; a capacitor comprising a first terminal and a second terminal; and an energy-manipulating circuit comprising a first terminal and a second terminal, the first terminal of the energy-manipulating circuit in electrical communication with the second terminal of the first switch, wherein the inductor, the switching arrangement, and the capacitor are electrically in communication in series with the at least one voltage source.

In some embodiments, the inductor, the switching arrangement and the capacitor are electrically in communication in series with at least one voltage source. In some embodiments, the anode terminal of the first diode is in electrical communication with the anode terminal of the second diode; wherein the first terminal of the first switch is in electrical communication with the cathode terminal of the first diode and the second terminal of the first switch is in electrical communication with the anode terminal of the first diode, wherein the first terminal of the second switch is in electrical communication with the anode terminal of the second diode and the second terminal of the second switch is in electrical communication with the cathode terminal of the second diode, and wherein the first terminal of the energy-manipulating circuit is in electrical communication with the anode terminal of the first diode.

In some embodiments, the system further comprises a switching timing control unit connected to all the switches, wherein the switching timing control comprises a routine to calculate the on and off timing of the switches to re-establish proper initial conditions on the capacitor after a low to high transition and a high to low transition. In some embodiments, the energy-manipulating circuit comprises a resistor. In some embodiments, the energy-manipulating circuit comprises: a resistor comprising a first terminal and a second terminal; a second inductor comprising a first terminal and a second terminal; and a third diode comprising a cathode terminal and an anode terminal, wherein the second inductor is in electrical communication in series with the resistor, the second inductor and the resistor together in parallel with the third diode, wherein the first terminal of the energy-manipulating circuit is in electrical communication with the cathode terminal of the third diode. In some embodiments, the energy-manipulating circuit comprises: a third switch comprising a first terminal and a second terminal; a second inductor comprising a first terminal and a second terminal; a third diode comprising a cathode terminal and an anode terminal; and a fourth diode comprising a cathode terminal and an anode terminal, wherein the second inductor is in electrical communication in series with the third switch via an electrical node, the second inductor and the third switch together in parallel with the third diode, wherein the first terminal of the energy-manipulating circuit is in electrical communication with the cathode terminal of the third diode, and wherein the anode terminal of the fourth diode is in electrical communication with the electrical node.

In some embodiments, the first switch and the second switch comprise BJT transistors, MOSFET IGBTs, thyristor, or any switching device, the switching device may be made of Si (Silicon), SiC (Silicon Carbide), Gallium Nitride, or any other semiconductor material suited to build a switching device. In some embodiments, the at least one voltage source comprises a plurality of windings about a toroid. In some embodiments, the at least one voltage source further comprises a set of diodes and capacitances connected to form a rectifier or doubler. In some embodiments, the electronic system is in series with a plurality of substantially identical electronic systems as part of an X-ray emission system for computed tomography.

Certain embodiments contemplate a method for fast kV switching in a power system, comprising: opening a first switch and closing a second switch to produce a first voltage; and opening the second switch and closing the first switch to produce a second voltage, wherein the first switch comprises: a first terminal in electrical communication with a cathode terminal of a first diode; a second terminal in electrical communication with an anode terminal of the first diode and an anode terminal of a second diode; and wherein the second switch comprises: a first terminal in electrical communication with the anode terminal of the first diode, the anode terminal of the second diode, and a first node of a transition improving circuit; and a second terminal in electrical communication with a cathode terminal of the second diode; the first and second switch in electrical communication in series with an inductor and a capacitor, and one or more voltage sources.

In some embodiments, opening a first switch and closing a second switch to produce a first voltage and opening the second switch and closing the first switch to produce a second voltage comprises calculating the on and off timing of the first switch and the second switch to re-establish proper initial conditions on the capacitor after every transition low to high and high to low kV. In some embodiments, the energy-manipulating circuit comprises a resistor. In some embodiments, the energy-manipulating circuit comprises: a resistor comprising a first terminal and a second terminal; a second inductor comprising a first terminal and a second terminal; and a third diode comprising a cathode terminal and an anode terminal, wherein the second inductor is in electrical communication in series with the resistor, the second inductor and the resistor together in parallel with the third diode, wherein the first terminal of the energy-manipulating circuit is in electrical communication with the cathode terminal of the third diode.

In some embodiments, the energy-manipulating circuit comprises: a third switch comprising a first terminal and a second terminal; a second inductor comprising a first terminal and a second terminal; a third diode comprising a cathode terminal and an anode terminal; and a fourth diode comprising a cathode terminal and an anode terminal, wherein the second inductor is in electrical communication in series with the third switch via an electrical node, the second inductor and the third switch together in parallel with the third diode, wherein the first terminal of the energy-manipulating circuit is in electrical communication with the cathode terminal of the third diode, and wherein the anode terminal of the fourth diode is in electrical communication with the electrical node and the cathode terminal of the fourth diode is in electrical communication with a terminal of the at least one voltage source. In some embodiments, the first switch and the second switch comprise BJT transistors. In some embodiments, the at least one voltage source comprises a plurality of windings about a toroid. In some embodiments, the switches are part of an electronic system which is in series with a plurality of substantially identical electronic systems as part of an X-ray emission system for computed tomography.

Any combination or permutation of embodiments is envisaged. Other objects and features will become apparent from the following detailed description considered in conjunction with the accompanying drawings. It is to be understood, however, that the drawings are designed as an illustration only and not as a definition of the limits of the invention.

DESCRIPTION OF EXEMPLARY EMBODIMENTS

Figure 1:
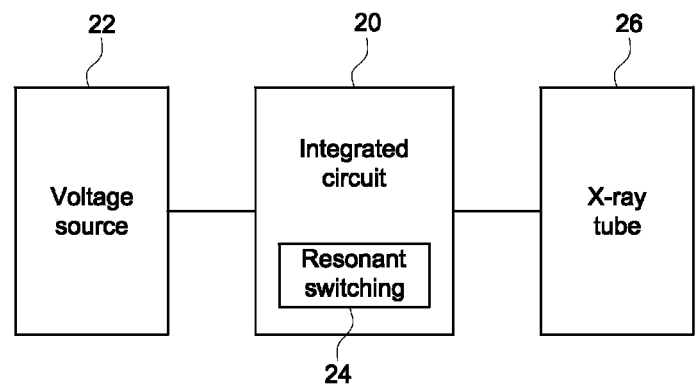
FIG. 1 is a simplified block diagram of a switching architecture having an interposer circuit according to an embodiment of the invention.

In exemplary embodiments, an X-ray imaging system, such as a CT system, may switch between high and low voltages to emit photons having different mean frequencies from the X-ray tube. Objects having different densities (such as different organs) may be more accurately imaged by detecting photons having different mean frequencies. The detector and X-ray tube should be synchronized so that the control logic associated with the detector is configured to receive low frequency photons when low frequency photons are emitted and configured to receive high frequency photons when high frequency photons are emitted. Unfortunately, delay in the X-ray tube behavior may result in longer rise and fall times in the voltage. The detector may accordingly receive higher frequency photons when seeking to detect lower frequency photons and lower frequency photons when seeking to detect higher frequency photons. Losses, hysteresis cycles, and leakage currents, collectively referred to herein as "non-idealities" may result in undesirable rise and fall times. These effects may be particularly pronounced at low currents. Accordingly, present embodiments contemplate circuits which facilitate more efficient voltage rise and fall times to improve emission and detection synchronization. Particularly, various embodiments contemplate circuitry aimed to remove energy from one capacitor and return the energy to a "voltage source" or to dissipate the removed energy into a resistor.

Power System Overview

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

The various embodiments are described herein within a particular operating environment including a particular imaging system, such as a "third generation" computed tomography (CT) system (e.g., a sixty-four-slice CT system). It should be appreciated by one skilled in the art that embodiments of the invention are equally applicable for use with other configurations and systems, such as luggage screening systems. Furthermore, the embodiments are applicable to X-ray radiographic imaging systems as well as X-ray tomosynthesis imaging systems. Additionally, embodiments of the invention will be described with respect to the detection and conversion of X-rays. However, one skilled in the art will further appreciate that embodiments of the invention are equally applicable for the detection and conversion of other high frequency electromagnetic energy. Also, the X-ray tube and detector are described to rotate around the object being imaged, but alternate configurations wherein the detector and X-ray source are held stationary and the object is rotated are also contemplated, such as used for industrial non-destructive testing purposes. Hence, although discussed in the context of CT systems, the various embodiments may be applied to projection X-ray imaging used in other medical and industrial radiographic applications as well.

Figure 6:
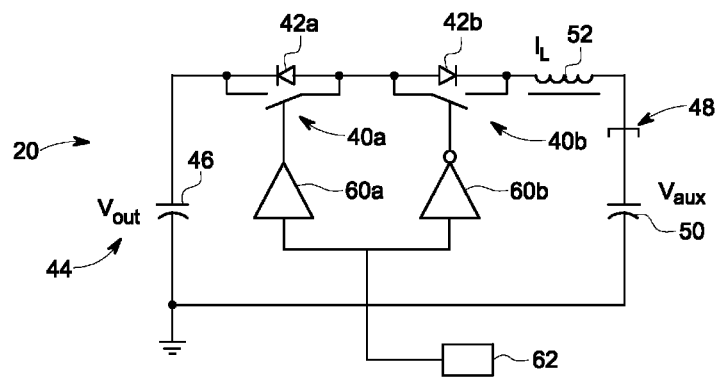
FIG. 6 is a simplified circuit schematic diagram illustrating operation of various embodiments of the invention.

Although, for the purposes of explanation, many of the examples discussed herein will present circuit structures as they are applied to an interposer structure, one will recognize that this is merely for ease of explanation and that the same concepts of energy removal can be applied anywhere an energy recovery structure such as the one illustrated in FIG. 6 is used. That is, the disclosed concepts can be used where the structure in FIG. 6 is used as a single unit, as a module that repeats a multiple N times, or just as a portion of a larger electrical system.

Various embodiments provide a switching architecture including an active resonant interposer circuit configured to switch or assist in switching between a first voltage level and a second voltage level. For example, the various embodiments provide switching between a low kilovolt (kV) level, applied by a generator, to a high kV level with a stable voltage during the scanning integration periods. The interposer circuit provides resonant switching with energy recovery such that the energy resulting from transition to a high kV level is stored when returning to a low kV level, then used again and recirculated when going from the low kV level to the high kV level. Additionally, the various embodiments can provide a voltage waveform with variable frequency and duty cycle, including a constant high or low voltage level. By practicing various embodiments, fast switching between the first voltage level and the second voltage level (e.g., high and low voltage levels) may be achieved. The embodiments enable improved separation in the mean energy of applied X-ray spectra, thereby improving material decomposition and effective atomic number estimation of a scanned object. Additionally, the various embodiments may be implemented in systems where the voltage to be switched is very large (e.g., from 60 kV to 200 kV or greater), the parasitic capacitances to ground are also very large, or the energy required by the load is relatively small, as is the case for industrial inspection systems utilizing stationary anode X-ray tube technology. Additionally, because of the resonant transitions, the described embodiments may reduce electromagnetic interference (EMI).

As illustrated in FIG. 1, a switching architecture in one embodiment includes an active resonant interposer circuit 20 (hereafter referred to as the interposer circuit 20) connected to a voltage source 22 (e.g., a high voltage generator) and an X-ray tube 26. The interposer circuit 20, which may be configured as an active resonant module, includes resonant switching component(s) 24 that facilitate switching of the voltage generated from the voltage source 22 and applied to an X-ray tube 26. For example, in operation, the interposer circuit 20 with the resonant switching component 24 provides switching between a high kV level (e.g., 140 kV) and a low kV level (e.g., 80 kV) during resonance. However, it should be noted that other high and low voltage levels may be provided and the various embodiments are not limited to a particular voltage level. As another example, the high kV level can range from a few tens of kV (e.g., ~30 kV for mammography) to hundreds of kV (e.g., ~450 kV for industrial inspection applications). The energy is reused and recirculated when switching between the voltage levels energy, which saves the energy and allows faster switching. In some embodiments, switching between the voltage levels is provided in about 10-100 microseconds or less.

Figure 2:
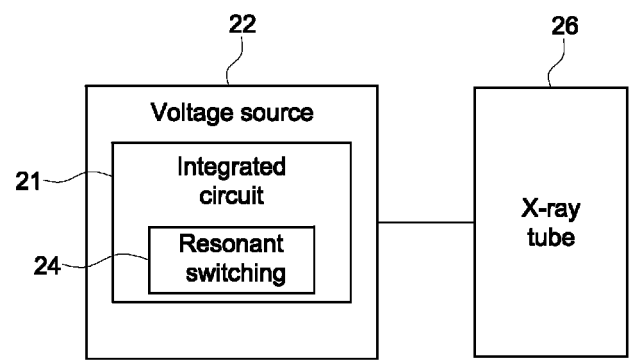
FIG. 2 is a simplified block diagram of another switching architecture having an integrated interposer circuit according to an embodiment of the invention.

The embodiment illustrated in FIG. 1 includes the interposer circuit 20 connected to the voltage source 22, such as in an add-on configuration. The various embodiments are not limited to such a configuration and switching architecture. For example, as illustrated in FIG. 2, the interposer circuit 20 may be integrated with or form part of the voltage source 22 and is illustrated as an integrated circuit 21 in the embodiment. In the active resonant configuration of the various embodiments, the electronics in the system can transmit power to the X-ray tube 26, for example, to charge or continue to provide power to the load (e.g., vacuum tube) at high voltage operation. For example, in the embodiment of FIG. 1, energy is provided by the voltage source 22 at 80 kV and energy is provided to the X-ray tube 26 at 140 kV by both the voltage source 22 and the interposer circuit 20. Different configurations of the various embodiments will now be described in more detail below.

Figure 3:
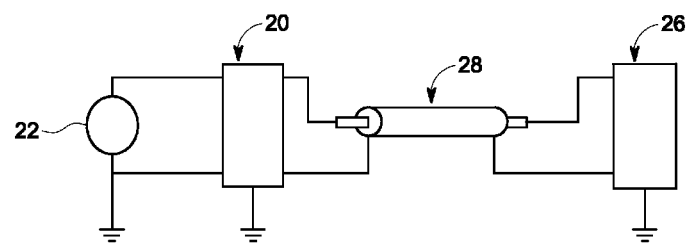
FIG. 3 is a block diagram showing a connection arrangement for an interposer circuit according to an embodiment of the invention.
Figure 4:
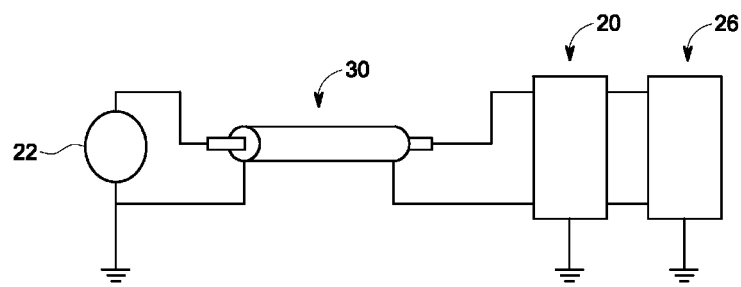
FIG. 4 is a block diagram showing a connection arrangement for an interposer circuit according to another embodiment of the invention.
Figure 5:
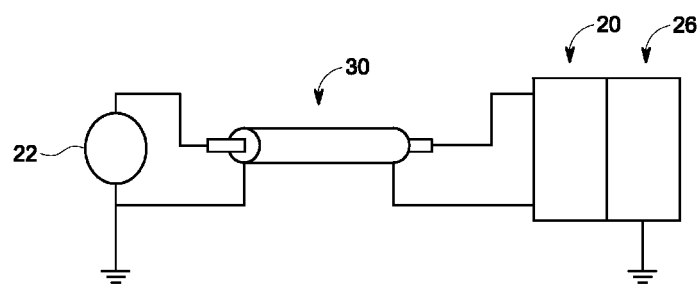
FIG. 5 is a block diagram showing a connection arrangement for an interposer circuit according to another embodiment of the invention.

As illustrated in FIGS. 3 through 5, the interposer circuit 20 may be connected in different configurations. The particular configuration selected may be based on the arrangement of the X-ray system in connection with which voltage switching is implemented. FIG. 3 illustrates an embodiment wherein the interposer circuit 20 is provided in proximity and connected to the voltage source 22 and connected to the X-ray tube 26 via a length of cable 28. It should be noted that a cable (not shown) is also provided to connect the interposer circuit 20 to the voltage source 22, which in this embodiment is shorter than the cable 28. The cable 28 connecting the interposer circuit 20 is rated for a higher voltage operation than the cable 30 illustrated in FIGS. 4 and 5. For example, the cable 28 in this embodiment is rated at the higher voltage level, such as 140 kV.

FIG. 4 illustrates the interposer circuit 20 in proximity and connected to the X-ray tube 26. In this embodiment, a length of cable 30 connects the interposer circuit 20 and the voltage source 22, such that the cable 30 is rated for a lower voltage operation than the cable 28 shown in FIG. 3, for example, 80 kV. The interposer circuit 20 also may be coupled directly to the X-ray tube 26, for example, by bolting the two components together, as shown in FIG. 5. However, in all three of the embodiments illustrated in FIGS. 3 through 5, the interposer circuit 20 is a separate unit connected to the system. It should be noted that the cable 28 or 30 is generally a high-voltage cable.

The embodiments illustrated in FIGS. 3 through 5 have an active configuration, which is capable of providing energy and power at both voltage levels. Accordingly, the voltage source 22 may be a high voltage generator capable of generating voltages corresponding to low levels, for example, 80 kV, and the interposer 20 with the voltage source 22 provides the extra energy/power needed to operate the load (e.g., vacuum chamber) at a high voltage level, for example, 140 kV.

A simplified schematic diagram of one of the modules or stages 80 forming the interposer circuit 20 is shown in FIG. 6. The interposer circuit 20 operates to store energy from the system operating when switching from a high voltage level to a low voltage level, and use the stored energy when transitioning to the next high voltage cycle. The switching of the interposer circuit 20 uses the stored energy that is resonantly stored by an inductor and a capacitor instead of through the load to provide fast switching in various embodiments (e.g., 10-100 microseconds or less).

Specifically, the operation, including the working principle of various embodiments is illustrated in the schematic of FIG. 6. The schematic represented in FIG. 6 includes a plurality of switching devices 40a and 40b connected in series. The switching devices 40a and 40b may be any type of switches. For example, the switching devices 40a and 40b may be metal-oxide-semiconductor field-effect transistors (MOSFETs) or insulated gate bipolar transistors (IGBTs). As illustrated by the buffers 60a and 60b, the switching devices 40a and 40b are operated in opposite state with respect to one another. Accordingly, when a control signal from a driver 62 (e.g., a logic clock) is transmitted to the switching devices 40a and 40b, one of the switching devices 40a and 40b receives the opposite drive signal such that one of the switching devices 40a and 40b is in an open state and one of the switching devices 40a and 40b is in a closed state. In various embodiments, the switching devices 40a and 40b are connected in a common source/emitter configuration to allow control by a single control line from the driver 62.

Each of the switching devices 40a and 40b is connected in parallel with a diode 42a and 42b, respectively, which operates as a blocking diode. The switching devices 40a and 40b are connected between a main or system capacitor 46 and an auxiliary capacitor 50. An inductor 52 is also connected in series between the capacitor 50 and the diode 40b. It should be noted that the inductor 52 also might be referred to as a resonant inductor.

The principle of operation, as described in more detail below, is such that energy is resonantly transferred from one capacitor to another capacitor, for example from capacitor 46 to capacitor 50, and vice versa. The switching speed of the transition between voltage levels is controlled by the inductor 52, and the capacitors 46 and 50. The inductor 52, and the capacitors 46 and 50 operate as resonant elements. In practice, and in some embodiments, the values of the capacitors 46 and 50 are set by the geometrical size of the connecting cable and vacuum tube, therefore the switching speed from one voltage level to another, is determined by the value of the inductor 52. For example, the smaller the value of the inductor 52, the faster the transition of the switching between high to low voltage, and vice versa. The transition speed of the devices 40a and 40b (in opening or closing) in various embodiments is much faster than the voltage transition speed.

As an example, when the voltage across the main capacitor 46 ($V_{out}$) is a high voltage level, the switching device 40a is in an open state and the switching device 40b is in a closed state (although in some embodiments this switch may also be open and its state may not be relevant during the steady state condition). In this high voltage state, when the switching device 40a operates as a short, energy transfer from the main capacitor 46 to the auxiliary capacitor 50 occurs. The transition from the high voltage state to a low voltage state, wherein the output voltage 44 decreases from a high voltage level to zero voltage level, is accomplished by switching of the switching devices 40a and 40b. In particular, the switching device 40a switches from an open state to a closed state and the switching device 40b switches from a closed state to an open state. It should be noted that the switching of the switching devices 40a and 40b is provided in parallel based on the signal from the driver 62. The switching of the switching devices 40a and 40b causes the resonance state to start and the energy in the capacitor 46 is transferred to the capacitor 50, through the inductor 52, for storage until the next high-voltage state is desired. When high voltage is desired, a resonant energy transfer from the capacitor 50 to the capacitor 46, through resonant inductor 52, is restarted by opening the switching device 40a and closing the switching device 40b, such that the energy stored in the capacitor 50 is transferred to the capacitor 46.

Thus, the active resonant interposer circuit 20 can actively send or transmit energy/power to the load under any voltage condition, whether high or low. Thus, active operation can include recharging in both the high and low voltage states/levels.

Figure 7:
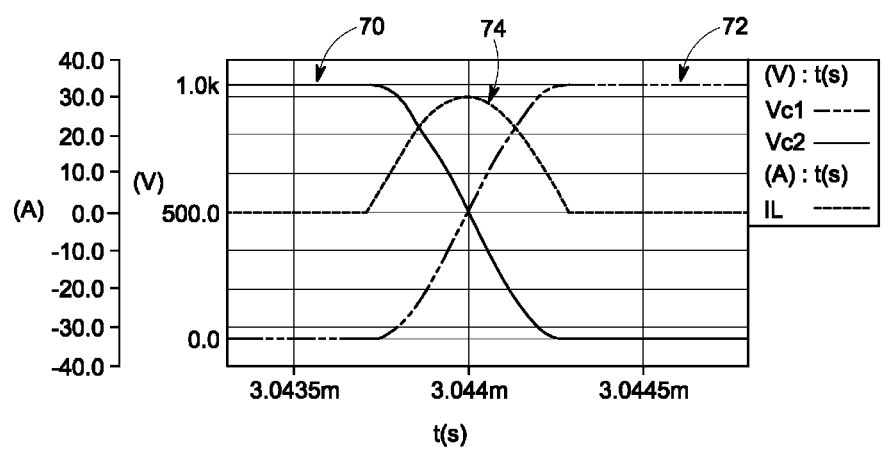
FIG. 7 is a graph of waveforms showing a low to high voltage operation of various embodiments.
Figure 8:
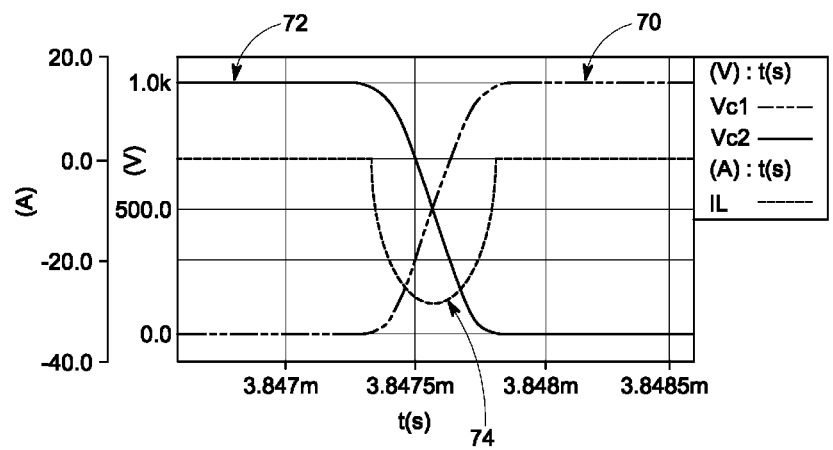
FIG. 8 is a graph of waveforms showing a high to low voltage operation of various embodiments.

FIGS. 7 and 8 are graphs illustrating waveforms of the voltage changes in the schematic circuit of FIG. 6 wherein the vertical axes represents the magnitude of the signal (e.g., voltage/current) and the horizontal axis represents time. In particular, the curve 70 represents the output voltage 44, the curve 72 represents the auxiliary voltage 48 and the curve 74 represents the current through the inductor 52. As demonstrated by the plots in FIG. 7, when the output voltage $V_{out}$ switches to the low voltage state, the energy is transferred from the capacitor 46 to the capacitor 50. As can be seen in FIG. 8, when the output voltage $V_{out}$ switches to the high voltage state, the energy stored in the capacitor 50 is reused and transferred back to the capacitor 46. Thus, an energy reuse scheme implements energy recovery such that the energy used to provide a high kV is recovered when returning to the low kV. The interposer circuit 20 (FIGS. 1, 3-5) operates such that energy transfer is provided during resonance.

Figure 9:
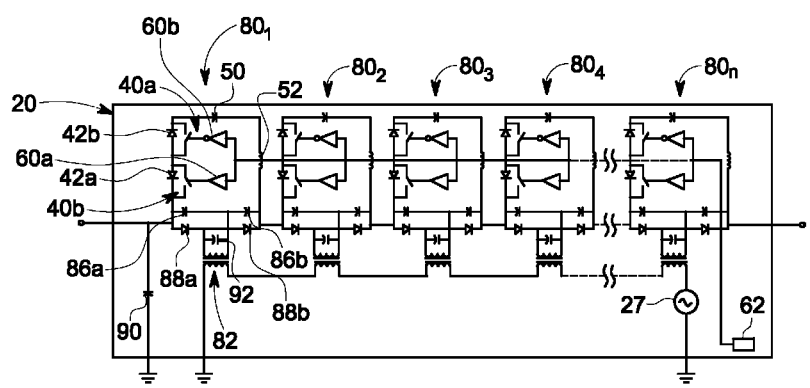
FIG. 9 is a schematic diagram the interposer circuit in accordance with an embodiment of the invention.
Figure 10:
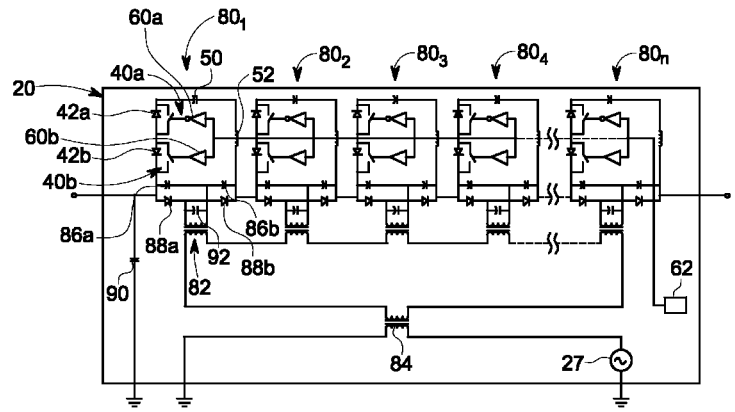
FIG. 10 is a schematic diagram of an interposer circuit in accordance with another embodiment of the invention.

The interposer circuit 20 is configured in an active mode as described herein and may include a plurality of switching stages, as well as several transformers and an additional power supply as illustrated in FIGS. 9 and 10. More particularly, a plurality of switching stages $80_1$ to $80_n$ may be provided, wherein like numeral represent like parts. It should be noted that each of the switching stages $80_1$ to $80_n$ include similar components and accordingly only the components in one of the switching stages are identified. It should be noted that the driver 62 drives all of the switching stages $80_1$ to $80_n$.

Figure 11:
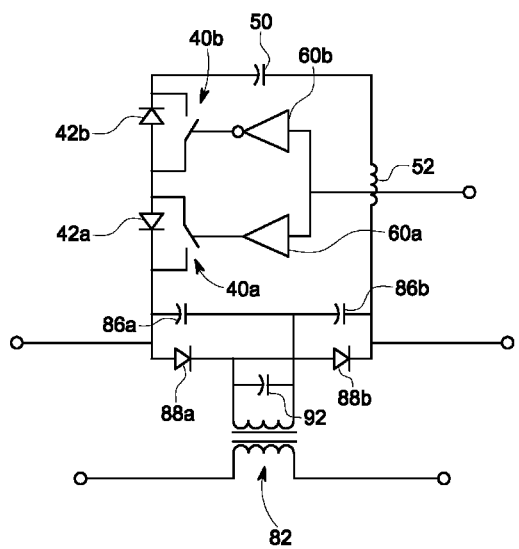
FIG. 11 is a schematic diagram of a module of the interposer circuits of FIGS. 9 and 10.

The interposer circuit 20 is formed by a plurality of switching stages 80. FIG. 11 represents the circuit schematic of each stage shown in FIG. 9 and FIG. 10. The stage represented in FIG. 11 includes a pair of capacitors 86a and 86b connected in parallel with a pair of blocking diodes 88a and 88b, respectively. This configuration may be referred to as a voltage doubler. The series connection of the capacitors 86a and 86b represent the main resonant capacitor (equivalent to capacitor 46 in FIG. 6). The stage in FIG. 11 includes two switching devices 40a and 40b, connected in series. The switching devices 40a and 40b may be any type of switches, such as a pair of transistors. For example, the switching devices 40a and 40b may be metal-oxide-semiconductor field-effect transistors (MOSFETs) or insulated gate bipolar transistors (IGBTs). Two diodes 42a and 42b are connected in parallel to the switching devices 40a and 40b. The switches and diode may be made with Si (Silicon), SiC (Silicon Carbide) or any other semiconductor material that is suitable to build such switches or diodes. Finally, the stage in FIG. 11 includes a resonant inductor 52, and an auxiliary capacitance 50. This stage operates as previously described herein. In particular, the capacitor 50 (the auxiliary capacitor) operates to receive the energy from the discharging capacitors 86a and 86b, and keeps or stores the energy while the system is in the low voltage state, such that the energy may be used in the transition to the high voltage state to recharge the capacitors 86a and 86b, as described in more detail herein, using the switching operation of the switching devices 40a and 40b. Thus, through the resonance cycle, the energy stored in the capacitor 50 is transferred back to the capacitors 86a and 86b when the system is in high voltage state. The capacitors 86a and 86b are maintained at a desired or required voltage by the secondary windings of the transformer 82.

The stage shown in FIG. 11 includes one rectifier circuit known as a doubler. The doubler includes the secondary transformer 82, the diodes 88a and 88b, and the capacitors 86a and 86b. It should be noted that this rectifier can be replaced by a common full bridge rectifier, where the two capacitances 86a and 86b are replaced by two diodes. Additionally the stage represented in FIG. 11 may include a transformer 82 with multiple secondary windings and a rectifying circuit connected to the secondary. All these rectifying circuits are connected in series and to one resonant circuit per transformer 82. For example, the stage may have a transformer 82 with three secondary windings, three rectifying circuits connected in series and one resonant circuit connected across all three rectifying circuits.

The configuration of FIGS. 9 and 10 each include a transformer 82 connected to each of the switching stages $80_1$ to $80_n$. In FIGS. 9 and 10, the voltage source 22 is not shown. The voltage source 22 (shown in FIG. 1) would be connected in parallel with the input capacitance 90. The additional energy and power necessary to sustain the high voltage during operation is provided through the transformers 82. FIGS. 9 and 10 show two different configurations to connect the transformers 82 to the additional power supply.

In particular, FIG. 9 shows an embodiment where the rectifiers that include transformers 82 are connected in series and to the voltage supply 27. In this configuration, the power is transmitted directly from the voltage source 27 to the secondaries of the transformers 82. FIG. 10 shows another embodiment of the active interposer. According to this embodiment, the power supply 27 is connected to the transformers 82 by means of the transformer 84. This configuration is useful to decrease the isolation stress across the primary of the transformers 82.

In operation, when a high voltage output is desired, the transformer 82 operates to charge, and keep charged, the pair of series connected capacitors 86a and 86b through the diodes 88a and 88b. It should be noted that the capacitors 86a and 86b cannot be discharged through the diodes 88a and 88b. The active interposer configuration operates such that in a lower voltage state, a capacitor 90 (shown in FIGS. 9 and 10) is charged at a low voltage level, for example, 100 kV. In this low voltage level, the capacitors 86a and 86b are not charged. When at the high voltage level, the capacitors 86a and 86b are charged, for example, to 40 kV, such that the total output voltage is 140 kV. The series connected capacitors 86a and 86b are discharged, to transition the output voltage back to 100 kV, through a resonant cycle and the energy is transferred to the capacitor 50. The capacitor 50 (the auxiliary capacitor) operates to receive the energy from the discharging capacitors 86a and 86b, and stores the energy in the low voltage state, such that the energy may be used in the transition to the high voltage state to recharge the capacitors 86a and 86b as described in more detail herein using the switching operation of the switching devices 40a and 40b. Thus, through the resonance cycle, the energy stored in the capacitor 50 is transferred back to the capacitors 86a and 86b. It should be noted that a capacitor 92 is also connected in parallel with each of the transformers 82, which operates as a smoothing capacitor.

Thus, the configurations shown in FIGS. 9 and 10 can be implemented in an existing system and provide efficient and fast switching between two voltages. For example, these embodiments may be added to a high voltage source, such as in a CT imaging system, a radiographic X-ray system, or a tomosynthesis X-ray system. The add-on configurations may be connected between the voltage source and the vacuum tube. In other embodiments of an active configuration, the switching circuitry is integrated within the system, for example, integrated as part of the voltage source.

Computed Tomography Scanner Overview

Figure 12A:
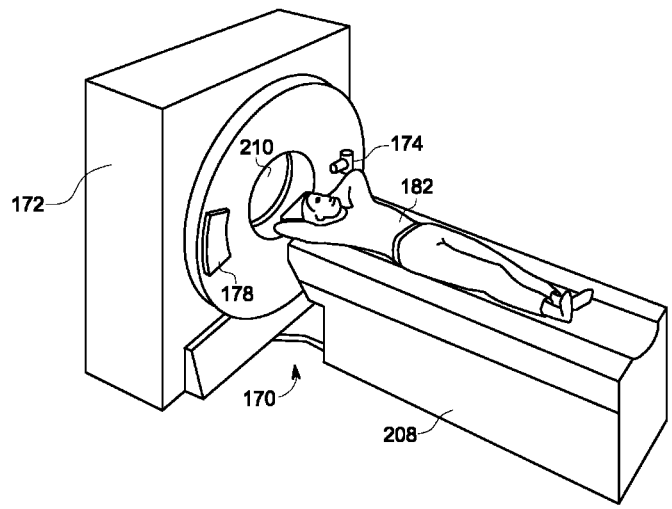
FIG. 12A is a pictorial view of a computed tomography (CT) imaging system in connection with which various embodiments may be implemented.
Figure 12B:
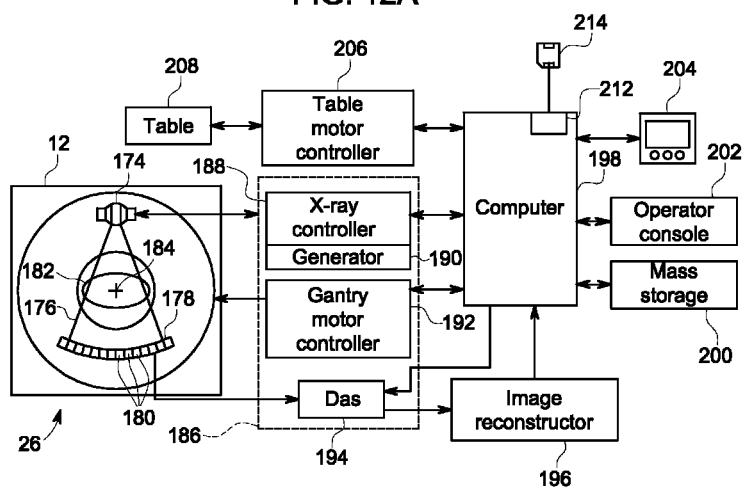
FIG. 12B is a block schematic diagram of the CT imaging system of FIG. 12A.

FIG. 12A is a pictorial view of a CT imaging system 170. FIG. 12B is a block schematic diagram of the system 170 illustrated in FIG. 12A. In the exemplary embodiment, the CT imaging system 170 is shown as including a gantry 172 representative of a "third generation" CT imaging system. The gantry 172 has an X-ray source 174 that projects a cone beam 176 of X-rays toward a detector array 178 on the opposite side of gantry 172.

The detector array 178 may be formed by a plurality of detector rows (not shown) including a plurality of detector elements 180 that together sense the projected X-ray beams that pass through an object, such as a medical patient 182 or piece of luggage. Each detector element 180 may produce an electrical signal that represents the intensity of an impinging X-ray radiation beam and hence is indicative of the attenuation of the beam as it passes through object or patient 182. The intensity may correspond to the number of incident photons at the element. An imaging system 170 having a multislice detector 178 may be capable of providing a plurality of images representative of a volume of object 182. Each image of the plurality of images corresponds to a separate "slice" of the volume. The "thickness" or aperture of the slice is dependent upon the height of the detector rows.

During a scan to acquire X-ray projection data, a rotating section within the gantry 172 and the components mounted thereon rotate about a center of rotation 184. FIG. 12B shows only a single row of detector elements 180 (i.e., a detector row). However, the multislice detector array 178 may include a plurality of parallel detector rows of detector elements 180 such that projection data corresponding to cone-beam geometry can be acquired simultaneously during a scan.

Rotation of components within the gantry 172 and the operation of radiation source 174 may be governed by a control mechanism 186. The control mechanism 186 includes an X-ray controller 188 and generator 190 that provides power and timing signals to the X-ray source 174 and a gantry motor controller 192 that controls the rotational speed and position of rotating portion of gantry 172. A data acquisition system (DAS) 194 in the control mechanism 186 samples analog data from detector elements 180 and converts the data to digital signals for subsequent processing. An image reconstructor 196 receives sampled and digitized measurement data from the DAS 194 and performs high-speed image reconstruction. The reconstructed image is applied as an input to a computer 198 that stores the image in a mass storage device 200. Although shown as a separate device, image reconstructor 196 may be special hardware located inside computer 198 or software executing within computer 198.

The computer 198 also receives commands and scanning parameters from an operator via a console 202 that has a keyboard and/or other user input device(s). An associated display system 204 allows the operator to observe the reconstructed image and other data from the computer 198. The operator supplied commands and parameters may be used by the computer 198 to provide control signals and information to the DAS 194, X-ray controller 188, generator 190 and gantry motor controller 192. In addition, the computer 198 operates a table motor controller 206 that controls a motorized table 208 to position the patient 182 in the gantry 172. The table 208 moves portions of the patient 182 through a gantry opening 210.

In one embodiment, the computer 198 includes a device 212, for example, a floppy disk drive, CD-ROM drive, DVD-ROM drive, or a solid state hard drive for reading instructions and/or data from a computer-readable medium 214, such as a floppy disk, CD-ROM, or DVD. It should be understood that other types of suitable computer-readable memory are recognized to exist (e.g., CD-RW and flash memory, to name just two), and that this description is not intended to exclude any of these. In another embodiment, the computer 198 executes instructions stored in firmware (not shown). Generally, a processor in at least one of the DAS 194, reconstructor 196, and computer 198 shown in FIG. 12B may be programmed to execute control commands to perform switching as described in more detail herein. The switching is not limited to practice in the CT system 170 and can be utilized in connection with many other types and variations of imaging systems. In one embodiment, the computer 198 is programmed to perform different functions to switch the switching devices described herein, accordingly, as used herein, the term computer is not limited to just those integrated circuits referred to in the art as computers, but broadly refers to computers, processors, microcontrollers, microcomputers, programmable logic controllers, application specific integrated circuits, and other programmable circuits.

Figure 13:
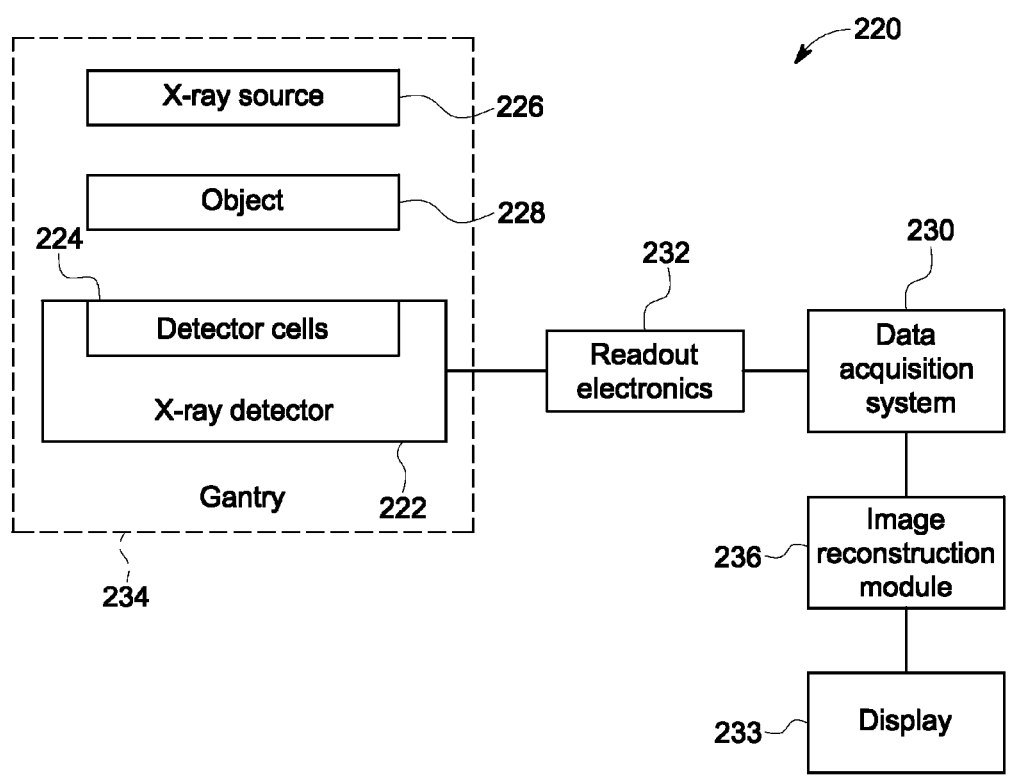
FIG. 13 is a schematic block diagram of an X-ray imaging system in connection with which various embodiments may be implemented.

FIG. 13 illustrates an X-ray imaging system 220 in which various embodiments may be implemented. The imaging system 220 generally includes an X-ray detector 222 having an array of detector cells 224 defining a scan area, and an X-ray source 226. Detector cells 224 may be the same as the elements 180 of the CT scanner of FIG. 12B in some embodiments. An object 228, such as a patient, is positioned between the X-ray source 226 and the X-ray detector 222, which may be one or more detectors or detector modules. However, the imaging system 220 may also scan other objects, such as in an industrial inspection application. The imaging system 220 also includes a data acquisition system 230 with readout electronics 232. Although shown separately in FIG. 13, the readout electronics 232 may reside within the X-ray detector 222 or the data acquisition system 230.

In one embodiment, the X-ray detector(s) 222 may be flat-panel detector systems such as an amorphous silicon flat panel detector or other type of digital X-ray image detector, such as a direct conversion detector as known to those skilled in the art. In another embodiment, the X-ray detector(s) 222 may include a scintillator having a screen that is positioned in front of the X-ray detector(s) 222.

It should be noted that the imaging system 220 may be implemented as a non-mobile or mobile imaging system. Moreover, the imaging system 220 may be provided in different configurations. For example, the image data may be generated with the X-ray source 226 positioned at discrete foci along an arc above the object to generate the image information using computed tomosynthesis procedures and processes (or may be in a radiographic configuration). In other embodiments, the X-ray source 226 and the X-ray detector 222 are both mounted at opposite ends of a gantry 234, which may be a C-arm that rotates about the object 228. The rotatable C-arm is a support structure that allows rotating the X-ray source 226 and the X-ray detector 222 around the object 228 along a substantially circular arc, to acquire a plurality of projection images of the object 228 at different angles (e.g., different views or projections) that are typically less than 360 degrees, but may comprise a full rotation in some circumstances.

In operation, the object 228 is positioned in the imaging system 220 for performing an imaging scan. For example, the X-ray source 226 may be positioned above, below or around the object 228. For example, the X-ray source 226 (and the X-ray detector(s) 222) may be moved between different positions around the object 228 using the gantry 234. X-rays are transmitted from the X-ray source 226 through the object 228 to the X-ray detector(s) 222, which detect X-rays impinging thereon.

The readout electronics 232 may include a reference and regulation board (RRB) or other data collection unit. The RRB may accommodate and connect data modules to transfer data (e.g., a plurality of views or projections) from the X-ray detector(s) 222 to the data acquisition system 230. Thus, the readout electronics 232 transmit the data from the X-ray detector(s) 222 to the data acquisition system 230. The data acquisition system 230 forms an image from the data and may store, display (e.g., on the display 233), and/or transmit the image. For example, the various embodiments may include an image reconstruction module 236, which may be implemented in hardware, software, or a combination thereof, that allows the data acquisition system to reconstruct images using X-ray data (e.g., radiographic or tomosynthesis data) acquired from the X-ray detector(s) 222 and as described in more detail herein.

Computed Tomography Scanner Overview—Computing Device

Figure 14:
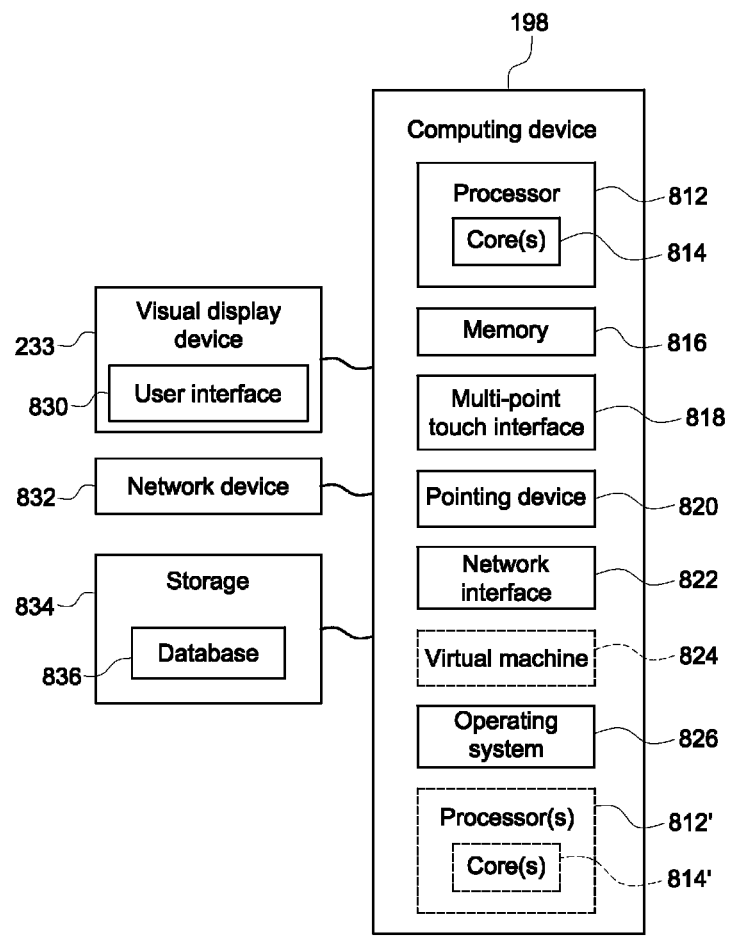
FIG. 14 is an exemplary computing device which may be programmed and/or configured to operate, for example, the system of FIGS. 12A,B and may also be used to implement certain processes described in relation to various embodiments of the present disclosure.

In some embodiments computer 198 may control the operation of the system 170 and may implement various aspects of the disclosed embodiments. FIG. 14 is a block diagram of an exemplary computing device 198 such as may be used in certain embodiments. The computing device 198 may include one or more non-transitory computer-readable media for storing one or more computer-executable instructions or software for implementing exemplary embodiments. The non-transitory computer-readable media may include, but are not limited to, one or more types of hardware memory, non-transitory tangible media (for example, one or more magnetic storage disks, one or more optical disks, one or more flash drives), and the like. For example, memory 816 included in the computing device 198 may store computer-readable and computer-executable instructions or software for interfacing with and/or controlling an operation of the scanner system 170. The computing device 198 may also include configurable and/or programmable processor 812 and associated core 814, and optionally, one or more additional configurable and/or programmable processing devices, e.g., processor(s) 812' and associated core(s) 814' (for example, in the case of computer systems having multiple processors/cores), for executing computer-readable and computer-executable instructions or software stored in the memory 816 and other programs for controlling system hardware. Processor 812 and processor(s) 812' may each be a single core processor or multiple core (814 and 814') processor.

Virtualization may be employed in the computing device 198 so that infrastructure and resources in the computing device may be shared dynamically. A virtual machine 824 may be provided to handle a process running on multiple processors so that the process appears to be using only one computing resource rather than multiple computing resources. Multiple virtual machines may also be used with one processor.

Memory 816 may include a computer system memory or random access memory, such as DRAM, SRAM, EDO RAM, and the like. Memory 816 may include other types of memory as well, or combinations thereof.

A user may interact with the computing device 198 through a visual display device 233, such as a computer monitor, which may display one or more user interfaces 830 that may be provided in accordance with exemplary embodiments. Visual display device 233 may be the same as display system 204 in some embodiments. The computing device 198 may include other I/O devices for receiving input from a user, for example, a keyboard or any suitable multi-point touch interface 818, a pointing device 820 (e.g., a mouse). The interface 818 such as a keyboard and the pointing device 820 may be coupled to the visual display device 233. The computing device 198 may include other suitable conventional I/O peripherals.

The computing device 198 may also include one or more storage devices 834, such as a hard-drive, CD-ROM, or other computer readable media, for storing data and computer-readable instructions and/or software that interface with and/or control an operation of the scanner system 170 described herein and/or to implement exemplary processes and methods described herein. Exemplary storage device 834 may also store one or more databases for storing any suitable information required to implement exemplary embodiments. For example, exemplary storage device 834 can store one or more databases 836 for storing information, such as scan sequences, X-ray data, X-ray images, photon counts, estimation of electrical properties, electrical property maps, and/or any other information that can be used to implement exemplary embodiments of the present disclosure. The databases may be updated by manually or automatically at any suitable time to add, delete, and/or update one or more items in the databases.

The computing device 198 can include a network interface 822 configured to interface via one or more network devices 832 with one or more networks, for example, Local Area Network (LAN), Wide Area Network (WAN) or the Internet through a variety of connections including, but not limited to, standard telephone lines, LAN or WAN links (for example, 802.11, T1, T3, 56 kb, X.25), broadband connections (for example, ISDN, Frame Relay, ATM), wireless connections, controller area network (CAN), or some combination of any or all of the above. The network interface 822 may include a built-in network adapter, network interface card, PCMCIA network card, card bus network adapter, wireless network adapter, USB network adapter, modem or any other device suitable for interfacing the computing device 198 to any type of network capable of communication and performing the operations described herein. Moreover, the computing device 198 may be any computer system, such as a workstation, desktop computer, server, laptop, handheld computer, tablet computer, or other form of computing or telecommunications device that is capable of communication and that has sufficient processor power and memory capacity to perform the operations described herein.

The computing device 198 may run any operating system 826, such as any of the versions of the Microsoft® Windows® operating systems, the different releases of the Unix and Linux operating systems, any version of the MacOS® for Macintosh computers, any embedded operating system, any real-time operating system, any open source operating system, any proprietary operating system, or any other operating system capable of running on the computing device and performing the operations described herein. In exemplary embodiments, the operating system 826 may be run in native mode or emulated mode. In an exemplary embodiment, the operating system 826 may be run on one or more cloud machine instances.

In certain embodiments, the CT system 170 can be configured and/or programmed to transmit instructions, commands, and/or requests to the computing device 198 to control the CT-scan components to perform scan sequences and can be programmed and/or configured to receive CT-scan data or CT-scan images from the computing device 198.

Voltage Waveform Behavior

Figure 15:
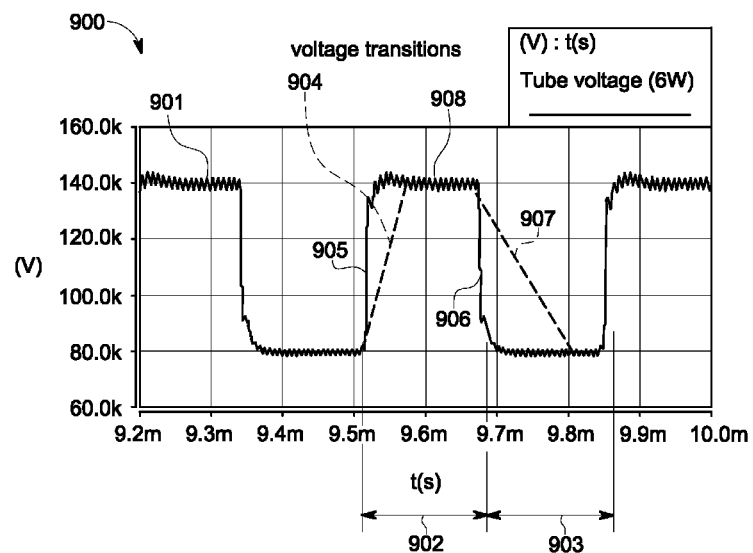
FIG. 15 is a timing diagram of an X-ray tube voltage with extended rise and fall times.

FIG. 15 depicts a timing diagram of an X-ray tube voltage rise and fall times. During scanning the voltage 901 in the system will oscillate between high 902 and low 903 periods. The waveform depicts the rise 905 from the low period to a high period and the fall 906 from a high period to a low period. Various non-idealities, as discussed above, may prevent the system from generating a crisp square waveform. For example, where the system includes parasitic capacitances and resistances it inefficiently transfers and dissipates energy causing the capacitance 40 to stray away from the optimal energy rate after the transition of energy to the system capacitance. As a consequence, the voltage will be slow to fall and a more extended fall time 907 will result. Because the detector system operates under the assumption that the rise 905 and fall 907 times are relatively consistent, skew in either may result in improper X-ray emissions and undesirable detection events. For example, the skewed fall time 907 may result in photons which are of a higher frequency than desired being detected by the system when the system in fact excepts photons at a lower frequency associated with the low period 903. Accordingly, the present embodiments contemplate modifications to the system to ensure more crisp rise and fall times.

Circuitry Module

Figure 16:
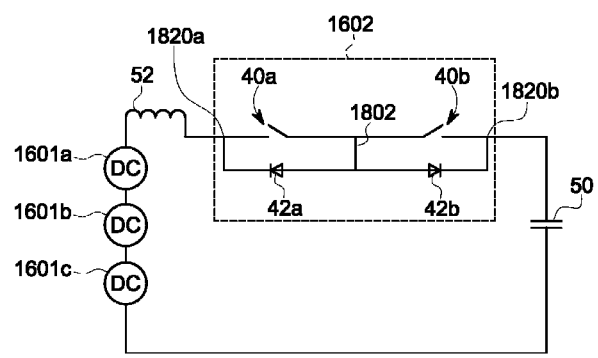
FIG. 16 is a variation on the simplified circuit schematic diagram of FIG. 6.

FIG. 16 depicts a circuitry module, such as an interposer circuit, as may be implemented in certain embodiments, having various features of the circuit of FIG. 6. In this example, the circuit is in electrical communication with a plurality of the windings 1601*a-c* about a toroid. These windings may serve as a voltage source. The plurality of windings may be connected each to a rectifier, and the plurality of rectifiers may be connected in series and may be in electrical communication with an inductor 52. Though the inductor 52 is illustrated here as being connected with the voltage sources directly, one will readily understand that inductor 52, the switching arrangement 1602, and capacitor 50 may be in series with one another in a variety of permutations, while still providing substantially equivalent functionality. Though inductor 52, capacitor 50, and switching arrangement 1602 are illustrated in series via nodes 1820*a* and 1820*b* other permutations are possible. This configuration facilitates quick energy management of the system. The capacitance 50 may facilitate faster transitions (10 µs or faster) even under low electron beam conditions as described in greater detail below. One will recognize variations in the component layout of switching arrangement 1602 that will achieve substantially the same functionality.

Figure 17A:
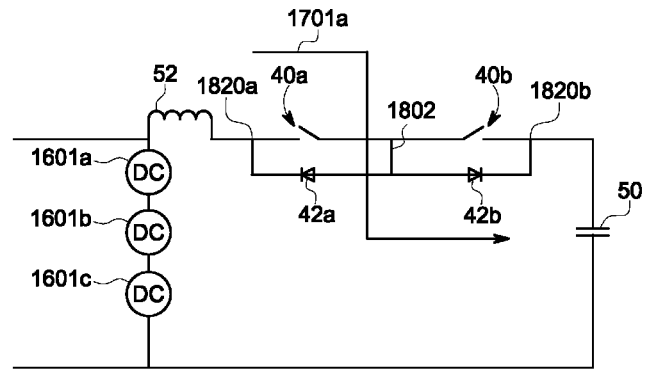
FIG. 17A depicts the current flow direction during a high to low voltage transition (a "fall") in the resonant circuit.
Figure 17B:
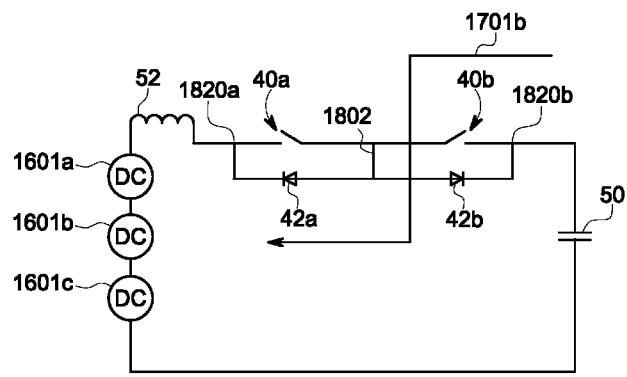
FIG. 17B depicts the current flow direction during a low to high voltage transition in the resonant circuit.

FIGS. 17A and 17B depict the current flow in the high to low (a "fall") voltage and low to high (a "rise") voltage transitions respectively. During a fall in voltage, switches 40*a* and 40*b* are activated and inactivated respectively such that current 1701*a* travels through the inductor and is stored in capacitor 50. Diodes 42*a* and 42*b* ensure the proper flow of current, preventing flow backwards towards the voltage source. Conversely, during a voltage rise, switches 40*a* and 40*b* are inactivated and activated respectively so that current 1701*b* flows from the capacitor 50 and to the voltage sources, to supplement the voltage change. Again, the diodes 42*a* and 42*b* ensure the proper flow of current outward from the capacitor. As mentioned above, the inductor, capacitor and switching arrangement may be electrically coupled in series in a variety of permutations. These elements may remain electrically coupled even when placed in series or in parallel with additional incidental intervening elements which do not substantially affect their function.

Circuitry Module Variations

Figure 18A:
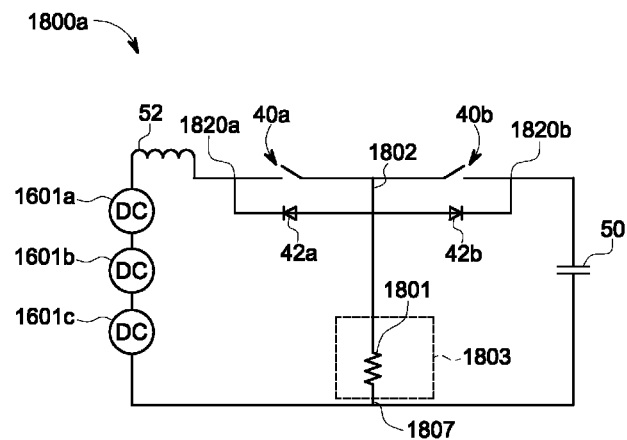
FIG. 18A depicts a first variation in the circuit diagram of FIG. 16.
Figure 18B:
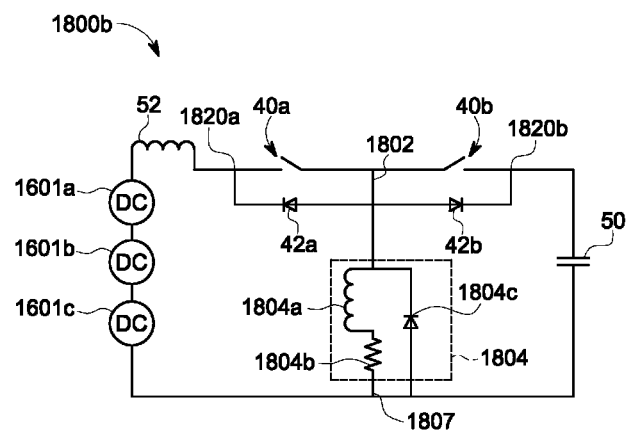
FIG. 18B depicts a second variation in the circuit diagram of FIG. 16.
Figure 18C:
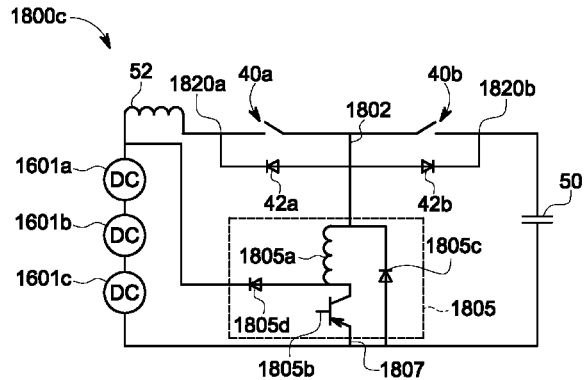
FIG. 18C depicts a third variation in the circuit diagram of FIG. 16.

FIGS. 18A-C depict variations to the circuit module of FIG. 6, FIG. 16, FIG. 17A, and FIG. 17B. These variations allow re-instating the optimal energy level in the capacitance 50 after the transition of energy to the system capacitance, thus allowing a much faster transition. FIG. 18A depicts a circuit 1800A having an intervening resistor 1801 as part of an energy-manipulating circuit 1803 connected at nodes 1802 and 1807. Resistor 1801 is in electrical communication with the node 1802 between diodes 42a and 42b and between switches 40a and 40b. The resistor is also in communication with the node 1807 following the inductor 52, switching arrangement 1602, and capacitor 50 series. The energy-manipulating circuit 1803 can lose energy during both a voltage rise and a voltage fall.

Using the circuit shown in FIG. 18A, the proper energy level on capacitor 50 may be re-instated by keeping on switch 40b for an additional period after the transition from low kV to high kV is concluded. The extra on time facilitates the discharge of some of the stored energy in the capacitance 50 into the resistor 1801 thus re-instating the proper energy level and providing for a much faster transition. The extra on time may be properly calculated and enforced in order to avoid unwanted and damaging energy losses.

FIG. 18B depicts another improved circuit configuration. Here, energy-manipulating circuit 1804 comprises an inductor 1804a, a resistor 1804b and a diode 1804c. Inductor 1804a and resistor 1804b may be in electrical communication in series in any permutation, and together in parallel with diode 1804c. In this example, the energy-manipulating circuit 1804 can lose energy when needed. In many embodiments, the circuit 1804 does not substantially affect a voltage rise.

Using the circuit shown in FIG. 18B, the proper energy level on capacitor 50 may be re-instated by keeping on switch 40b for an additional period after the transition from low kV to high kV is concluded. The extra on time facilitates the discharge of some of the stored energy in the capacitance 50 into the resistor 1804b thus re-instating the proper energy level and providing a much faster transition. The extra on time may be properly calculated and enforced in order to avoid unwanted and damaging energy losses.

The inductance 1804a shown in FIG. 18B may prevent energy from being dissipated during the transition from high kV to low kV. After the transition from low kV to high kV, during the extra on time of the switch 40b, part of the energy may also be accumulated in the inductor 1804a. The diode 1804c facilitates the dissipation of this accumulated energy into the resistor 1804b.

FIG. 18C depicts another improved circuit configuration. Here, energy-manipulating circuit 1805 comprises an inductor 1805a, a switch 1805b and a diode 1805c. Inductor 1805a and switch 1805b may be in electrical communication in series in any permutation, and together in parallel with diode 1805c. The diode 1805d provides electrical communication between the node connecting the switch 1805b and inductor 1805a and the voltage source node 1601a. The energy-manipulating circuit 1805 returns rather than dissipates energy. Although illustrated as a transistor in this example, switch 1805b may be any acceptable switching device as switches 40a and 40b (e.g. MOSFETs, IGBTs, etc.) though possibly with different operational ranges.

Using the circuit shown in FIG. 18C, the proper energy level on capacitor 50 may be re-instated by keeping on switch 40b for an additional period after the transition from low kV to high kV is concluded and by turning on the switch 1805b after the transition from low kV to high kV is concluded such that both switches 40b and 1805b are on at generally the same time after the resonant transition is concluded. The extra on time of both switches 40b and 1805b facilitates the discharge of some of the stored energy in the capacitance 50 into the inductor 1805a thus re-instating the proper energy level and allowing for a much faster transition. The extra on time may be properly calculated and enforced in order to avoid unwanted and damaging energy losses.

Once the capacitor 50 is discharged such that the proper energy level is re-instated switches 40b and 1805b may be opened and the energy stored in the inductor 1805a may be returned to the system capacitance through the diodes 1805c and 1805d. Once the energy is completely returned to the system capacitance, the diodes 1805c and 1805d enter the blocking voltage mode and the full transition is over. Accordingly, in some embodiments this type of circuitry returns the energy to the full system instead of dissipating the energy into a resistor.

The resistors 1801 and 1804b may, for example, be any of MP916, MP925, and MP930 TO-220 style power package as are known in the art. In some embodiments resistors 1801 and 1804b may be 50 kOhm resistors and inductors 1804a and 1805a may be 120 mH.

Again, as mentioned above, the elements depicted in these circuits may remain electrically coupled even when placed in series or in parallel with additional incidental intervening elements which do not substantially affect their function.

Circuitry Module—Effect

Figure 19A:
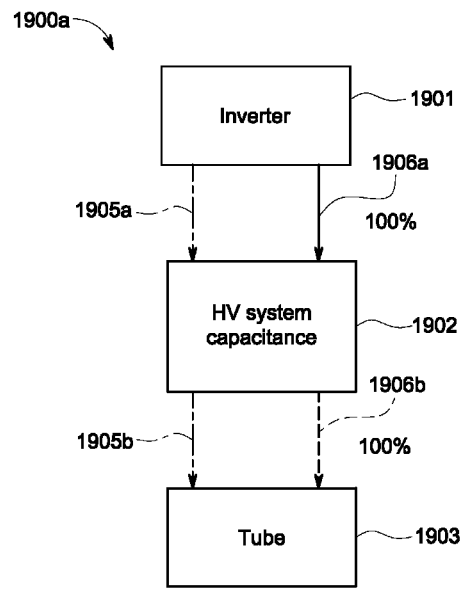
FIG. 19A depicts the current flow for rising and falling voltages without application of certain of the embodiments.

FIG. 19A depicts the interactions between the inverter 1901, the high voltage capacitance 1902, and the X-ray tube 1903. During a voltage rise, current 1905a will flow from the inverter to the high voltage capacitance. Similarly, during a voltage fall, current 1905b will flow from the high voltage capacitance to the X-ray tube 1903. In addition to these standard currents 1905a, 1905b, the system can demand an additional movement of energy 1906a from the inverter to the high voltage system during a rise, and energy movement 1906b from the high voltage system to the X-ray tube during a fall. As indicated in FIG. 19A, in the absence of the auxiliary capacitance provided in such circuits as those of FIGS. 18A-C, all this energy will be transferred from the inverter 1901 and high voltage system capacitance 1902 during a voltage rise and voltage fall respectively. Current energy 1906a may be insufficient to facilitate a rapid rise time and current energy 1906b may contribute undesirable additional energy to the system, prolonging the voltage fall.

Figure 19B:
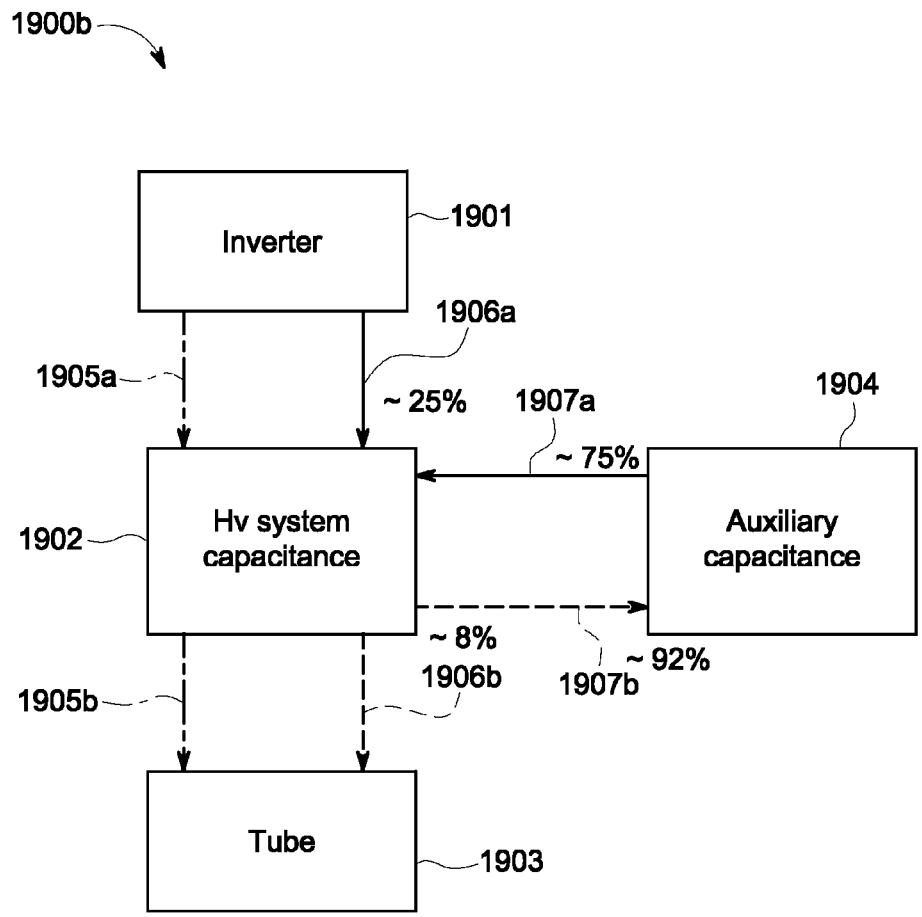
FIG. 19B depicts the current flow for rising and falling voltages with application of certain of the embodiments.

As depicted in FIG. 19B, the addition of the auxiliary capacitance 1904 will reduce the demands on the inverter 1901 and the high voltage system 1902. By virtue of the present embodiments, at least approximately 75% of the energy 1907a during a voltage rise may be contributed to the high voltage system from the auxiliary capacitance 1904 rather than from the inverter 1901. Similarly, during a voltage fall, at least approximately 92% of the energy 1907b that would have traveled to the tube 1903 is instead redirected to the auxiliary capacitance 1904 (only approximately 8% 1906b travels to the tube 1903). This redirection improves the fall time, preventing excess energy from delaying the voltage transition. Similarly, the flow 1907a improves the rise time by contributing energy available from the auxiliary capacitance 1904.

Circuitry Module—Example Waveform

Figure 20:
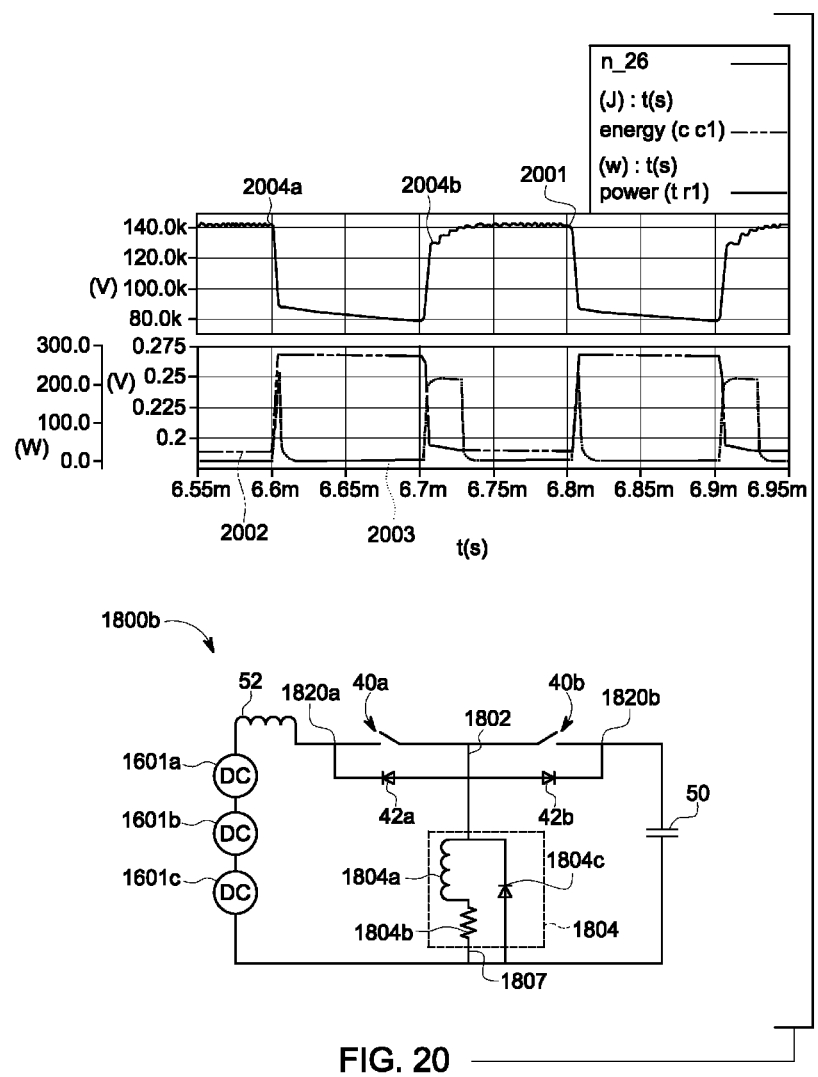
FIG. 20 depicts exemplary waveforms associated with the energy-manipulating circuit of FIG. 18B.

FIG. 20 depicts exemplary waveforms associated with the energy-manipulating circuit of FIG. 18B. Waveform 2001 depicts the voltage in the X-ray tube. Waveform 2002 depicts the energy stored in the capacitor 50. Waveform 2003 depicts the energy dissipated by the resistor 1804b.

When the X-ray tube voltage 2001 falls from high to low (e.g., at the position 2004a), the energy in the capacitor 2002 increases and plateaus. During this transition, the resistor 1804b will dissipate a minimal amount of energy before the inductor 1804a in conjunction with the other circuit elements, such as diode 1804c minimizes the energy dissipated during the transition from high kV to low kV. Similarly, when the X-ray tube voltage 2001 rises from low kV to high kV (e.g. at the position 2004b) the capacitor 50 will discharge its energy as indicated by waveform 2002, better facilitating the rise in the tube voltage 2001. The system may activate switch 40b during the voltage rise for a longer period of time, than when switch 40a is activated during a voltage fall, to ensure more complete dissipation of the energy, therefore re-establishing the proper energy state, in the capacitor 50. A more prolonged dissipation will occur in the resistor 1804b in the voltage fall rather than in a voltage rise. Generally speaking, the larger the inductor 1804a, the lower the energy loss during the voltage fall. Similarly, the larger the resistor 1804b the lower the energy loss during the voltage fall. However, increasing the resistance of resistor 1804b may also require the switch 40b to remain active longer during a voltage rise.

Remarks

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component or step. Likewise, a single element, component or step may be replaced with a plurality of elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other aspects, functions and advantages are also within the scope of the invention.

Exemplary flowcharts are provided herein for illustrative purposes and are non-limiting examples of methods. One of ordinary skill in the art will recognize that exemplary methods may include more or fewer steps than those illustrated in the exemplary flowcharts, and that the steps in the exemplary flowcharts may be performed in a different order than the order shown in the illustrative flowcharts.

I claim:

1. An electronic system for improving power system control comprising:
    a first inductor comprising a first terminal and a second terminal;
    a switching arrangement comprising:
        a first diode comprising a cathode terminal and an anode terminal;
        a second diode comprising a cathode terminal and an anode terminal;
        a first switch comprising a first terminal and a second terminal; and
        a second switch comprising a first terminal and a second terminal;
    a capacitor comprising a first terminal and a second terminal; and
    an energy-manipulating circuit comprising a first terminal and a second terminal, the first terminal of the energy-manipulating circuit in electrical communication with the second terminal of the first switch;
    wherein the inductor, the switching arrangement, and the capacitor are electrically in communication in series, and wherein the energy-manipulating circuit is connected in series to the first switch and second switch via an electrical node disposed between the first switch and second switch.

2. The system of claim 1, wherein the inductor, the switching arrangement and the capacitor are electrically in communication in series with at least one voltage source.

3. The system of claim 2, wherein the at least one voltage source comprises a plurality of windings about a toroid.

4. The system of claim 2, wherein the at least one voltage source further comprises a set of diodes and capacitances connected to form a rectifier or doubler.

5. The system of claim 1, wherein the anode terminal of the first diode is in electrical communication with the anode terminal of the second diode;
    wherein the first terminal of the first switch is in electrical communication with the cathode terminal of the first diode and the second terminal of the first switch is in electrical communication with the anode terminal of the first diode,
    wherein the first terminal of the second switch is in electrical communication with the anode terminal of the second diode and the second terminal of the second switch is in electrical communication with the cathode terminal of the second diode.

6. The system of claim 1, wherein the first terminal of the energy-manipulating circuit is in electrical communication with the anode terminal of the first diode.

7. The system of claim 1, wherein the energy-manipulating circuit comprises a resistor.

8. The system of claim 1, further comprising a switching timing control unit connected to all the switches, wherein the switching timing control unit comprises a routine to calculate the on and off timing of the switches to re-establish proper initial conditions on the capacitor after a low to high transition and a high to low transition.

9. The system of claim 1, wherein the energy-manipulating circuit comprises:
    a resistor comprising a first terminal and a second terminal;
    a second inductor comprising a first terminal and a second terminal; and
    a third diode comprising a cathode terminal and an anode terminal,
    wherein the second inductor is in electrical communication in series with the resistor, the second inductor and the resistor together in parallel with the third diode, and
    wherein the first terminal of the energy-manipulating circuit is in electrical communication with the cathode terminal of the third diode.

10. The system of claim 1, wherein the energy-manipulating circuit comprises:
    a third switch comprising a first terminal and a second terminal;
    a second inductor comprising a first terminal and a second terminal;
    a third diode comprising a cathode terminal and an anode terminal; and
    a fourth diode comprising a cathode terminal and an anode terminal,
    wherein the second inductor is in electrical communication in series with the third switch via an electrical node, the second inductor and the third switch together in parallel with the third diode, wherein the first terminal of the energy-manipulating circuit is in electrical communication with the cathode terminal of the third diode, and wherein the anode terminal of the fourth diode is in electrical communication with the electrical node.

11. The system of claim 1, wherein the first switch and the second switch comprise BJT transistors.

12. The system of claim 1, wherein the electronic system is in series with a plurality of substantially identical electronic systems as part of an X-ray emission system for computed tomography.

13. The system of claim 1, wherein the switches are part of an electronic system which is in series with a plurality of substantially identical electronic systems as part of an X-ray emission system for computed tomography.

14. A method for fast kV switching in a power system, comprising:
opening a first switch and closing a second switch to produce a first voltage; and
opening the second switch and closing the first switch to produce a second voltage,
wherein the first switch comprises:
    a first terminal in electrical communication with a cathode terminal of a first diode;
    a second terminal in electrical communication with an anode terminal of the first diode and an anode terminal of a second diode; and
wherein the second switch comprises:
    a first terminal in electrical communication with the anode terminal of the first diode, the anode terminal of the second diode, and an energy-manipulating circuit; and
    a second terminal in electrical communication with a cathode terminal of the second diode,
wherein the first and second switch are in electrical communication in series with an inductor, a capacitor, and one or more voltage sources, and wherein the energy-manipulating circuit is connected in series to the first switch and second switch via an electrical node disposed between the first switch and second switch.

15. The method of claim 14, wherein opening a first switch and closing a second switch to produce a first voltage and opening the second switch and closing the first switch to produce a second voltage comprises calculating the on and off timing of the first switch and the second switch to re-establish proper initial conditions on the capacitor after every transition low to high and high to low kV.

16. The method of claim 14, wherein the energy-manipulating circuit comprises a resistor.

17. The method of claim 14, wherein the energy-manipulating circuit comprises:
a resistor comprising a first terminal and a second terminal;
a second inductor comprising a first terminal and a second terminal; and
a third diode comprising a cathode terminal and an anode terminal,
wherein the second inductor is in electrical communication in series with the resistor, the second inductor and the resistor together in parallel with the third diode,
wherein the first terminal of the energy-manipulating circuit is in electrical communication with the cathode terminal of the third diode.

18. The method of claim 14, wherein the energy-manipulating circuit comprises:
a third switch comprising a first terminal and a second terminal;
a second inductor comprising a first terminal and a second terminal;
a third diode comprising a cathode terminal and an anode terminal; and
a fourth diode comprising a cathode terminal and an anode terminal,
wherein the second inductor is in electrical communication in series with the third switch via an electrical node, the second inductor and the third switch together in parallel with the third diode,
wherein the first terminal of the energy-manipulating circuit is in electrical communication with the cathode terminal of the third diode, and
wherein the anode terminal of the fourth diode is in electrical communication with the electrical node and the cathode terminal of the fourth diode is in electrical communication with a terminal of the at least one voltage source.

19. The method of claim 14, wherein the first switch and the second switch comprise BJT transistors.

20. The method of claim 14, wherein the at least one voltage source comprises a plurality of windings about a toroid.

* * * * *